(12) United States Patent
Li et al.

(10) Patent No.: US 11,320,699 B2
(45) Date of Patent: May 3, 2022

(54) DISPLAY PANEL AND MANUFACTURING METHOD

(71) Applicants: Beijing BOE Optoelectronics Technology Co., Ltd., Beijing (CN); BOE Technology Group Co., Ltd., Beijing (CN)

(72) Inventors: Yizhe Li, Beijing (CN); Shenkang Wu, Beijing (CN); Qi Jing, Beijing (CN); Xingpan Sun, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 245 days.

(21) Appl. No.: 16/386,862

(22) Filed: Apr. 17, 2019

(65) Prior Publication Data
US 2019/0391425 A1    Dec. 26, 2019

(30) Foreign Application Priority Data

Jun. 26, 2018    (CN) .......................... 201810672218.X (51) Int. Cl.
*G02F 1/13357*    (2006.01)
*F21V 8/00*    (2006.01)
*H05K 1/18*    (2006.01)
*G02F 1/1345*    (2006.01)
*G02F 1/1368*    (2006.01)
(Continued)

(52) U.S. Cl.
CPC ..... *G02F 1/133615* (2013.01); *G02B 6/0053* (2013.01); *G02B 6/0055* (2013.01);
(Continued)

(58) Field of Classification Search
CPC .......... G02F 1/133615; G02F 1/13454; G02F 1/133308; G02F 1/133314
See application file for complete search history.

(56) References Cited

U.S. PATENT DOCUMENTS

2002/0060832 A1* 5/2002 Murade ............. G02F 1/136286
359/245
2004/0004424 A1* 1/2004 Sakurai ............. G02F 1/133308
313/110
(Continued)

FOREIGN PATENT DOCUMENTS

| CN | 1656411 A | 8/2005 |
|---|---|---|
| CN | 101975361 A | 2/2011 |

(Continued)

OTHER PUBLICATIONS

Office Action for corresponding Chinese Application 201810672218.X dated Sep. 7, 2020.

*Primary Examiner* — Jessica M Merlin
(74) *Attorney, Agent, or Firm* — ArentFox Schiff LLP; Michael Fainberg (57) ABSTRACT

The present disclosure relates to the field of display technology, and discloses a display panel and a manufacturing method. The display panel includes a first substrate, a second substrate, a liquid crystal, and a backlight module, wherein the first substrate includes a display area and a bonding area adjacent to the display area, and the display area of the first substrate on one side close to the second substrate is provided with thin film transistors arranged in an array mode; the second substrate is disposed opposite to the display area of the first substrate; the liquid crystal is encapsulated between the first substrate and the second substrate; the area of the second substrate is smaller than that of the first substrate, and the second substrate is between the first substrate and the backlight module.

16 Claims, 6 Drawing Sheets

(51) Int. Cl.
*G02F 1/1333* (2006.01)
*G02F 1/133* (2006.01)
*G02F 1/1335* (2006.01)

(52) U.S. Cl.
CPC ......... *G02B 6/0083* (2013.01); *G02F 1/1336* (2013.01); *G02F 1/13454* (2013.01); *H05K 1/189* (2013.01); *G02B 6/0031* (2013.01); *G02B 6/0051* (2013.01); *G02B 6/0091* (2013.01); *G02F 1/1368* (2013.01); *G02F 1/13306* (2013.01); *G02F 1/133305* (2013.01); *G02F 1/133308* (2013.01); *G02F 1/133612* (2021.01); *H05K 2201/10136* (2013.01)

(56) References Cited

U.S. PATENT DOCUMENTS

| | | |
|---|---|---|
| 2005/0073628 A1 | 4/2005 | Morsch |
| 2014/0153281 A1 | 6/2014 | Zhao et al. |
| 2014/0313771 A1* | 10/2014 | Song .................... G02B 6/0031 362/611 |
| 2015/0070612 A1* | 3/2015 | Seo ..................... H01L 27/1225 349/43 |
| 2015/0185395 A1 | 7/2015 | Chang |
| 2017/0110684 A1 | 4/2017 | Wang |
| 2019/0384091 A1 | 12/2019 | Li et al. |
| 2020/0103691 A1* | 4/2020 | Ohashi .................... G09F 9/00 |

FOREIGN PATENT DOCUMENTS

| | | |
|---|---|---|
| CN | 102980105 A | 3/2013 |
| CN | 104749818 A | 7/2015 |
| CN | 105206653 A | 12/2015 |
| CN | 105739189 A | 7/2016 |
| CN | 205427382 U | 8/2016 |
| CN | 107589579 A | 1/2018 |
| CN | 107728365 A | 2/2018 |

* cited by examiner

DISPLAY PANEL AND MANUFACTURING METHOD

CROSS-REFERENCE TO RELATED APPLICATION

This application claims priority of Chinese Patent Application No. 201810672218.X, filed on Jun. 26, 2018, which is hereby incorporated by reference in its entirety.

FIELD

The present disclosure relates to the field of display technology, and in particular, to a display panel and a manufacturing method.

BACKGROUND

With the rapid development of display technology, various display panels on the market have already entered thousands of households with mobile phones, smart tablets and the like. In the development process of display panels, the thickness of the display panel becomes an important evaluation factor, and the lightening and thinning of the display device is also a large development trend. One direction of lightening and thinning of the existing display panel is to use ultra-thin glass as the cover of the display panel.

SUMMARY

The present disclosure provides the following technical solution.

A display panel includes a first substrate, a second substrate, a liquid crystal, and a backlight module, wherein the first substrate includes a display area and a bonding area adjacent to the display area, and the display area of the first substrate on one side close to the second substrate is provided with thin film transistors arranged in an array mode; the second substrate is disposed opposite to the display area of the first substrate; the liquid crystal is encapsulated between the first substrate and the second substrate; an area of the second substrate is smaller than that of the first substrate, and the second substrate is between the first substrate and the backlight module.

Optionally, the bonding area of the first substrate further comprises a driver configured to receive an external display signal to control operations of the thin film transistors.

Optionally, an edge of the first substrate further abuts a circuit board, wherein the circuit board and the first substrate form a panel cavity; the backlight module is disposed in the panel cavity.

Optionally, the circuit board includes a first circuit board and a second circuit board, wherein an edge of the first circuit board is bent to abut the edge of the first substrate and form a panel cavity with the first substrate, the second circuit board connects the backlight module with the first circuit board, and the first circuit board and the second circuit board are flexible circuit boards.

Optionally, the backlight module includes a backlight, a plastic frame, and a light guide plate, wherein the light guide plate is disposed corresponding to the display area of the first substrate, the plastic frame is in the panel cavity, the backlight is disposed in the panel cavity through the plastic frame, a light illumination direction of the backlight is perpendicular to the first substrate, the plastic frame has a reflective structure on one side corresponding to a light exit of the backlight, and a light emitted by the backlight is reflected by the reflective structure into the light guide plate.

Optionally, the backlight module further includes a reflective sheet, the reflective sheet is attached to one side of the light guide plate away from the first substrate, and one end of the reflective sheet close to the backlight is bent to abut and attached to the plastic frame.

Optionally, a circumferential side of the plastic frame of the backlight has a curved surface structure corresponding to the reflective sheet. Optionally, the backlight module further includes a diffusion sheet and a prism sheet, wherein the diffusion sheet and the prism sheet are attached to one side of the light guide plate close to the thin film transistors.

Optionally, the first substrate has a thickness of 0.6 to 0.8 mm.

DETAILED DESCRIPTION OF THE EMBODIMENTS

Embodiments of the present disclosure provide a display panel and a manufacturing method to reduce the thickness of the display panel and improve the screen-to-body ratio of the display device. In order to make the objects, technical solutions and advantages of the present disclosure more clear, the present disclosure will be further described in detail in the following embodiments.

Figure 1:
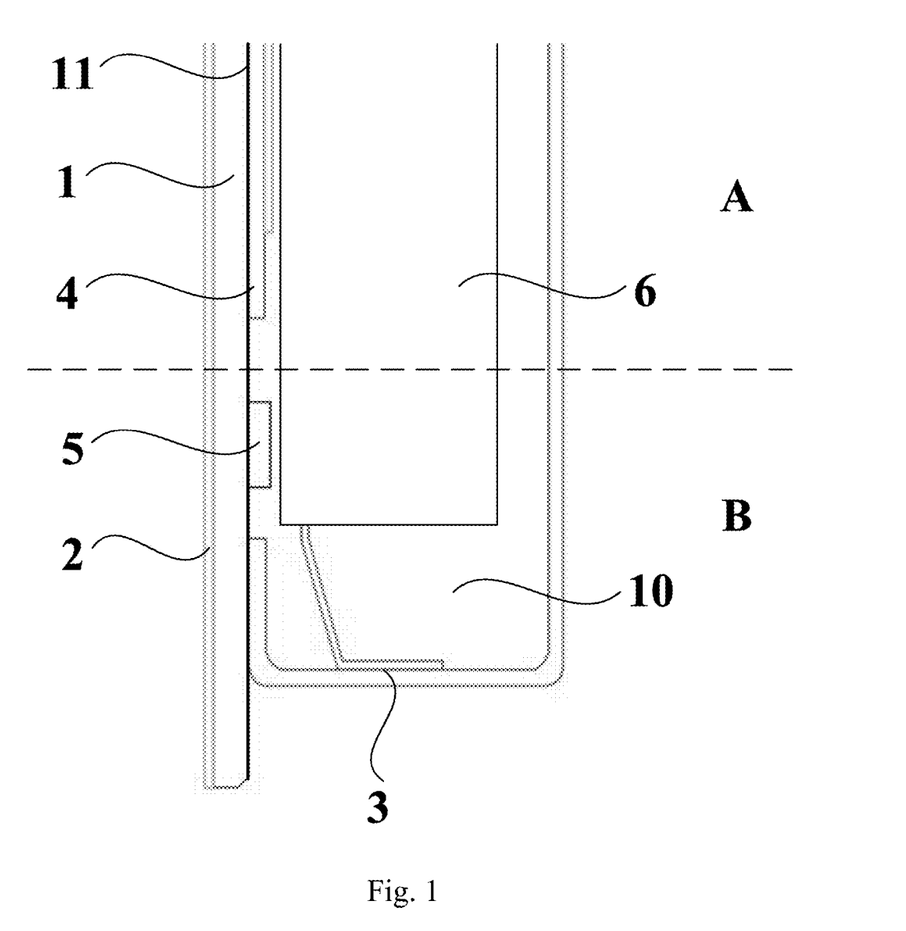
FIG. 1 is a schematic diagram of a partial structure of a display panel provided in an in some embodiments of the present disclosure.
Figure 2:
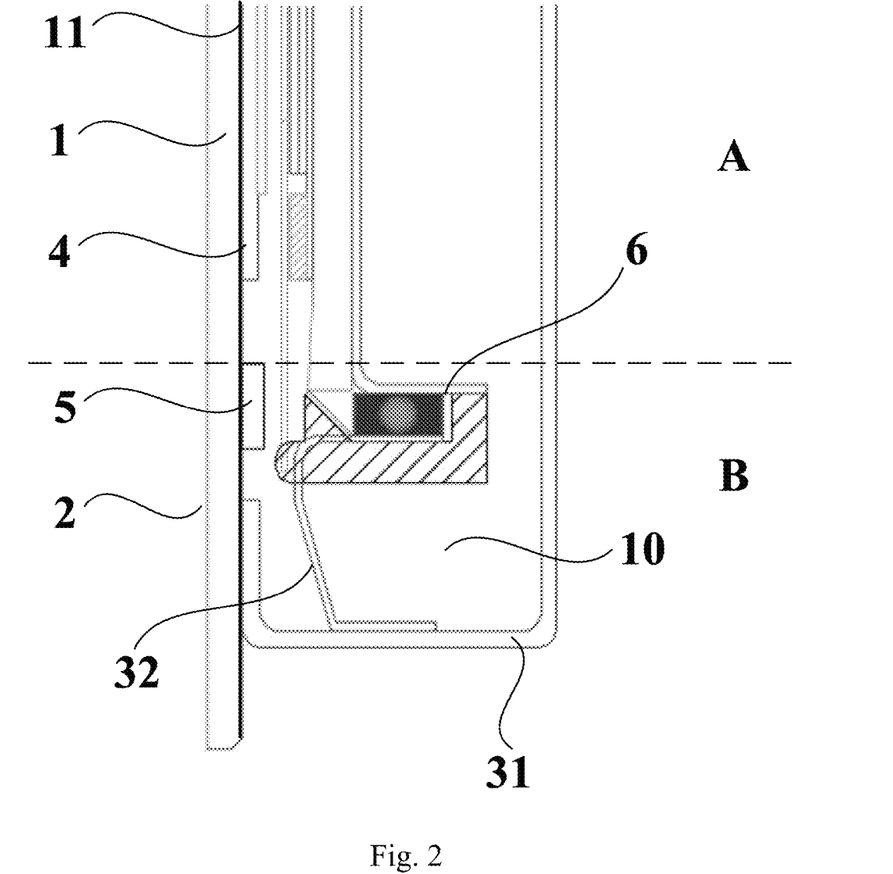
FIG. 2 is a schematic diagram of a partial section of a display panel provided in some embodiments of the present disclosure.

Referring to FIG. 1 and FIG. 2, a partial structure of a display panel provided in some embodiments of the present disclosure includes a first substrate 1, a polarizer 2, a color film layer, a liquid crystal, a circuit board 3, a second substrate 4, a driver 5 and a backlight module 6, wherein the first substrate 1 includes a display area AA and a bonding area BA adjacent to the display area AA, and one side surface of the display area AA of the first substrate 1 is provided with thin film transistors 11 arranged in an array mode; the second substrate 4 is in a box aligning connection with the display area AA of the first substrate 1; the liquid crystal is encapsulated between the first substrate 1 and the second substrate 4; the polarizer 2 is attached to one side surface of the first substrate 1; the color film layer (not shown) is attached to one surface of the first substrate 1 or the second substrate 4; the area of the second substrate 4 is smaller than that of the first substrate 1; the edge of the circuit board 3 is bent to abut the edge of the first substrate 1 and form a panel cavity 10 with the first substrate 1; the driver 5 is disposed in the bonding area BA of the first substrate 1, and receives a display signal external to the display panel to control the operation of the thin film transistors 11, the display signal external to the display panel including, but not limited to, an analog signal and a digital signal, and having a corresponding display element; the backlight module 6 is in the panel cavity 10 and is attached to the second substrate 4, the first substrate 1 is on the other side of the second substrate 4 with respect to the backlight module 6.

In the display panel provided in embodiments of the present disclosure as compared with the related art, the first substrate having thin film transistors is interchanged with the second substrate having a color film layer, and the first substrate having the thin film transistors is disposed on the outer layer of the second substrate having the color film layer, which allows the larger first substrate having the thin film transistors to be used as cover glass without an additional surface glass while ensuring the display of the display panel, thus achieving the overall thinning effect of the display panel. In addition, in the display panel provided in embodiments of the present disclosure, the color film layer may be attached to the first substrate or may be attached to the second substrate.

In an optional embodiment of the present disclosure, the circuit board 3 includes a first circuit board 31 and a second circuit board 32, wherein the edge of first circuit board 31 is bent to abut the edge of the first substrate 1 and is in a box aligning connection with the first substrate 1; the second circuit board 32 connects the backlight module 6 with the first circuit board 31, and the first circuit board 31 and the second circuit board 32 are flexible circuit boards. In the production process of the display panel, the performance of the circuit board may limit various parameters of the display panel. A flexible circuit board can be bent and has high folding resistance, which can meet the complex architecture requirements inside the display panel. Further, in some embodiments of the present disclosure, after the position of the second substrate having the color film layer is reversed with the position of the first substrate having the thin film transistors, the first substrate having the thin film transistors becomes the outermost glass, and the substrate glass of the first substrate having the thin film transistors needs to be thickened, thus ensuring the strength of the display panel. The thickness of the first substrate of the display panel in embodiments of the present disclosure is optionally 0.6 to 0.8 mm, such as 0.6 mm, 0.65 mm, 0.7 mm, 0.75 mm, and 0.8 mm. In such cases, the strength and thickness of the display panel are in an ideal state.

In some embodiments of the present disclosure, referring to FIG. 2, FIG. 3, FIG. 4 and FIG. 5, the backlight module 6 of the display panel includes a backlight 61, a plastic frame 62, and a light guide plate 63, wherein the light guide plate 63 is disposed corresponding to the display area AA of the first substrate 1, the plastic frame 62 is in the panel cavity 10, the backlight 61 is disposed through the plastic frame 62 in a projection area of the driver 5 in the panel cavity, the light illumination direction of the backlight 61 is perpendicular to the first substrate 1, the plastic frame 62 has a reflective device on one side corresponding to a light exit of the backlight 61, the reflective device includes, for example, a wedge surface 64 and a reflective strip 66, the light emitted by the backlight 61 is reflected by the wedge surface 64, that is, the reflective strip 66, into the light guide plate 63. The wedge surface in the embodiment of the present disclosure is only an optional example, and should not be construed as a specific limitation of the present disclosure. In practical applications, due to the uniform scattering and illuminating characteristics of the light guide plate, the reflective surface with a suitable shape and parameters, such as arc, lampshade, etc., can be selected according to the specific application situation. Similarly, the backlight in some embodiments of the present disclosure optionally adopts a light emitting diode (LED) which is very suitable for serving as the backlight of the display panel due to the characteristics of energy saving, environmental protection, safety, long life, low power consumption, low heat, high brightness, waterproofness, miniaturization, quakeproof, easy dimming, light beam concentration, simple maintenance and so on.

Figure 3:
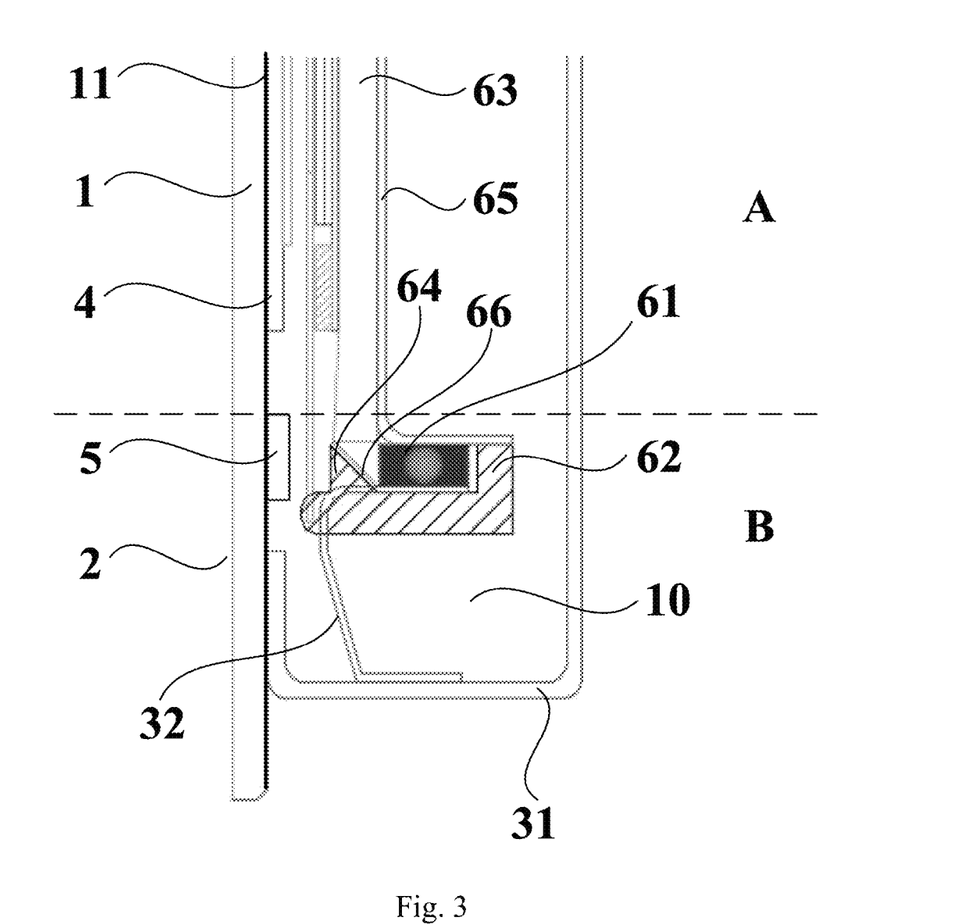
FIG. 3 is a schematic diagram of a partial section of a display panel provided in some embodiments of the present disclosure.
Figure 4:
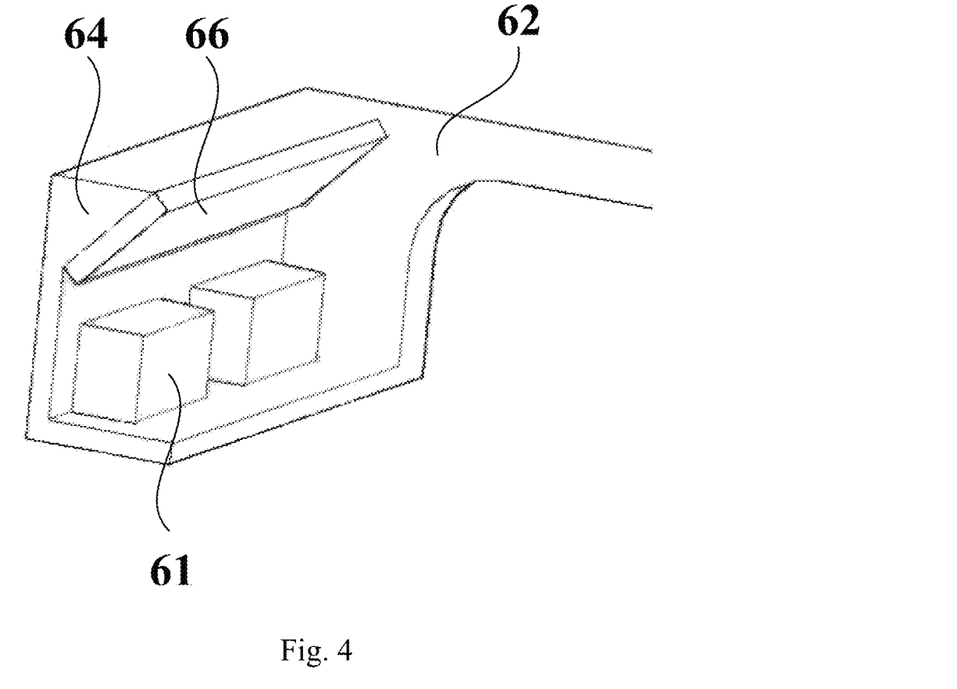
FIG. 4 is a schematic diagram of a partial structure of a display panel provided in some embodiments of the present disclosure.
Figure 5:
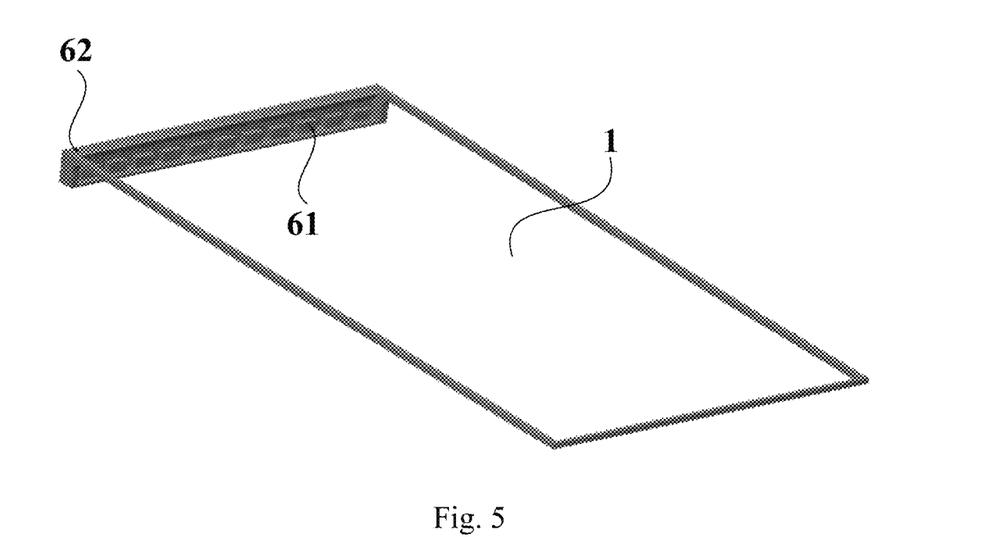
FIG. 5 is a schematic diagram of a display panel provided in some embodiments of the present disclosure.

In some embodiments of the present disclosure, after the position and orientation of the plastic frame are changed for the backlight module, the installation direction of the backlight is also changed, and then the entire backlight module is soldered to the circuit board. That is, as shown in FIG. 3 and FIG. 4, the length direction of the backlight is changed from the plane of the display panel to the direction perpendicular to the plane of the display panel. In the direction perpendicular to the panel, avoidance may be possible by combining the entire display panel or the display device, thereby increasing the relative illumination and display area of the display panel. The light emitted by the backlight also changes direction, and the emitted light is reflected into the light guide plate by arranging the wedge surface and reflective strip at the light exit of the backlight through the plastic frame.

In an optional solution of some embodiments of the present disclosure, as shown in FIG. 3 and FIG. 4, the wedge surface 64 is at an angle of 45° to the central axis of the optical path of the backlight 61. In order to smoothly guide the light into the light guide plate, it is necessary to add a 45° wedge surface 64 and a reflective strip 66 at the light exit of the backlight 61. The 45° wedge surface and reflective strip can reflect the light emitted by the backlight into the guide plate to a greater extent. The angle of 45° in some embodiments of the present disclosure is only an optional example and should not be construed as a specific limitation of the disclosure. Accordingly, the range of the angle can be selected from 15°-75°. Further, the backlight module 6 in some embodiments of the present disclosure further includes a reflective sheet 65, wherein the reflective sheet 65 is attached to one side of the light guide plate 63 away from the first substrate 1, and one end of the reflective sheet 65 close to the backlight 61 is bent to abut and is attached to the plastic frame 62. The reflective sheet can reflect the light in the light guide plate toward the back surface of the display panel, thereby increasing the light utilization efficiency in the light guide plate and improving the display brightness and effect of the display panel. As shown in FIG. 3 and FIG. 4, the circumferential side of the plastic frame 62 of the backlight 61 forms a curved surface structure corresponding to the reflective sheet 65, thereby facilitating the bending of the reflective sheet 65 at one end close to the backlight 61. The arrangement of the curved surface structure can further improve the smooth transition of the reflective sheet 65 and the plastic frame 62, thereby improving the reflective efficiency of the reflective sheet and improving the imaging effect of the display panel.

In an optional embodiment, the backlight module 6 further includes a diffusion sheet and a prism sheet, wherein the diffusion sheet and the prism sheet are attached to one side of the light guide plate 63 close to the thin film transistors. The diffusion sheet is disposed on one side of the light guide plate 63 close to the first substrate 1; and the prism sheet is disposed on the diffusion sheet 66. The diffusion sheet can concentrate the light emitted from the light guide plate and uniformly project it onto the prism sheet; the use of the prism sheet can eliminate the optical coupling of the display panel and reduce the reflection Moire effect, thereby increasing the brightness in the visible range of the display panel.

Figure 6:
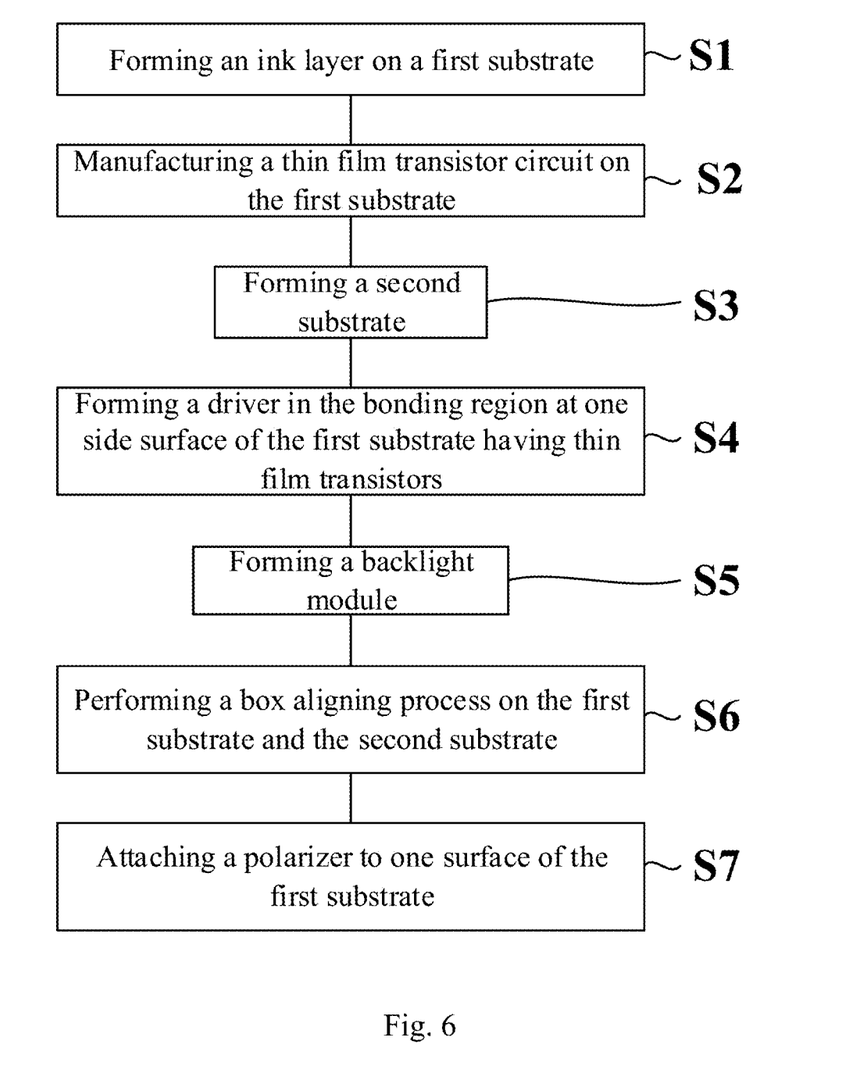
FIG. 6 is a flowchart of a manufacturing method of a display panel provided in some embodiments of the present disclosure.

Some embodiments of the disclosure further provide a manufacturing method of a display panel, as shown in FIG. 6, including:

Step S1: an ink layer is formed on a first substrate 1;

Step S2: a thin film transistor circuit is manufactured on the first substrate 1;

Step S3: a second substrate 4 is formed;

Step S4: a driver is formed in the bonding region BA at one side surface of the first substrate 1 having thin film transistors 11;

Step S5: a backlight module 6 is formed;

Step S6: a box aligning process is performed on the first substrate 1, and the edge of the circuit board 3 is bent to abut and is attached to the edge of one side surface of the first substrate 1;

Step S7: a polarizer 2 is attached to one surface of the first substrate 1.

In the display panel manufactured by the manufacturing method of a display panel in some embodiments of the present disclosure as compared with the related art, the first substrate having thin film transistors is interchanged with the second substrate having a color film layer, and the first substrate having the thin film transistors is disposed on the outer layer of the second substrate having the color film layer, which allows the larger first substrate having the thin film transistors to be used as cover glass without additional surface glass while ensuring the display of the display panel, thus achieving the overall thinning effect of the display panel.

Figure 7:
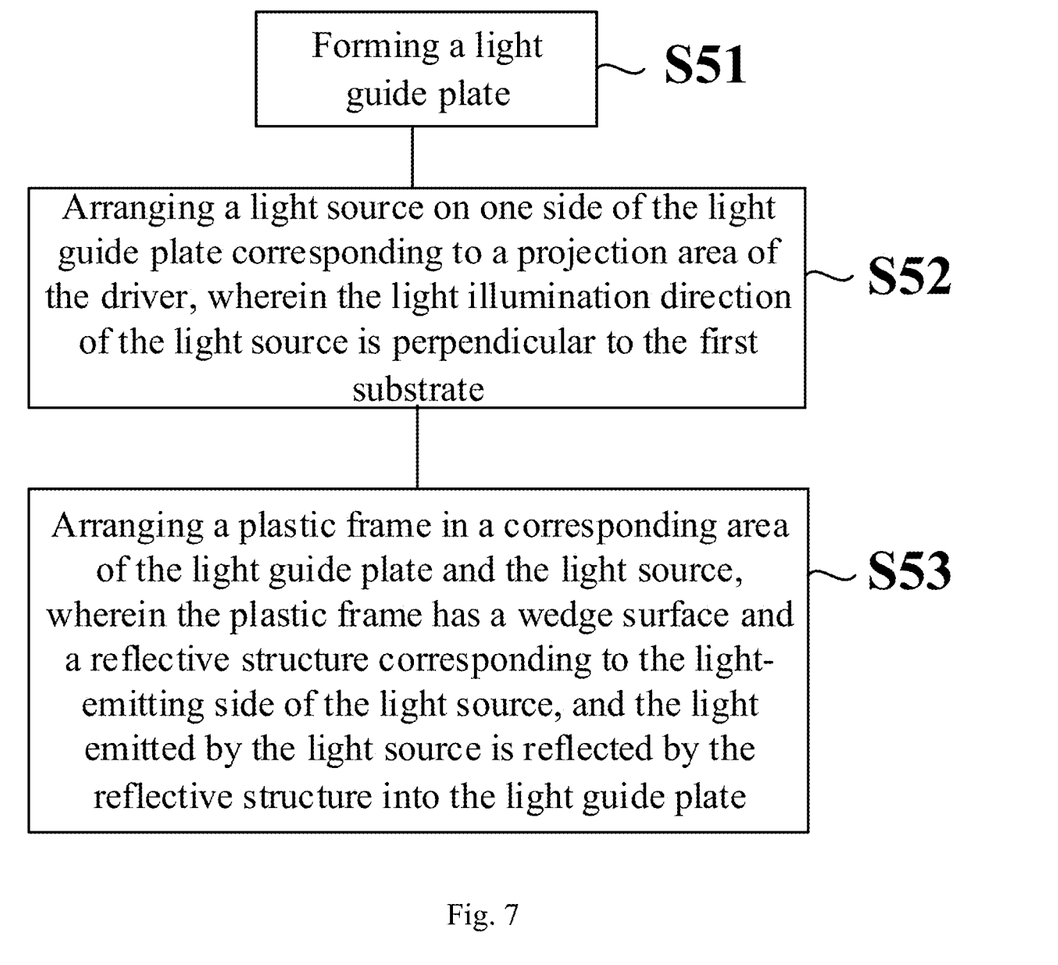
FIG. 7 is a flowchart of a manufacturing method of a display panel provided in some embodiments of the present disclosure.

Optionally, as shown in FIG. 7, the step S5 includes:

Step S51: a light guide plate 63 is formed;

Step S52: a backlight 61 is arranged on one side of the light guide plate 63 corresponding to a projection area of the driver 5, wherein the light illumination direction of the backlight 61 is perpendicular to the first substrate 1;

Step S53: a plastic frame 62 is arranged in a corresponding area of the light guide plate 63 and the backlight 61, wherein the plastic frame 62 has a wedge surface 64 and a reflective structure 65 corresponding to the light-emitting side of the backlight 61, and the light emitted by the backlight 61 is reflected by the reflective structure 65 into the light guide plate 63.

In the manufacturing method of a display panel in embodiments of the present disclosure, after the position and orientation of the plastic frame are changed for the backlight module, the installation direction of the backlight is also changed, and then the entire backlight module is soldered to the circuit board. That is, the length direction of the backlight is changed from the plane of the display panel to the direction perpendicular to the plane of the display panel. In the direction perpendicular to the panel, avoidance may be possible by combining the entire display panel or the display device, thereby increasing the relative illumination and display area of the display panel. The light emitted by the backlight also changes direction, and the emitted light is reflected into the light guide plate by arranging the wedge surface and reflective strip at the light exit of the backlight through the plastic frame.

Optionally, the manufacturing method of a display panel further includes:

Step S501: a diffusion sheet is arranged on one side of the light guide plate close to the first substrate;

Step S502: a prism sheet is arranged on the diffusion sheet;

Step S503: a reflective sheet is formed on one side of the light guide plate away from the first substrate and one side of the plastic frame close to the light guide plate.

Some embodiments of the present disclosure further provides a display device, including any display panel of the above embodiments. Furthermore, the first substrate 1 serves as a display side of the display device, and a transparent cover is not separately arranged on the outer side of the first substrate 1. The display device may be a product or a component having a display function, such as a mobile phone, a tablet computer, a digital photo frame, and a navigator. The larger first substrate 1 having the thin film transistors serves as cover glass without additional surface glass, thus achieving the overall thinning effect of the display device.

Obviously, a person skilled in the art can make various modifications and variations to the embodiments of the present disclosure without departing from the spirit and scope of the present disclosure. Thus, if these modifications and variations of the present disclosure fall within the scope of the claims of the present disclosure and the equivalent art, the present disclosure is also intended to include these modifications and variations.

The invention claimed is:

1. A display panel, comprising a first substrate, a second substrate, a liquid crystal, and a backlight module, wherein the first substrate comprises a display area and a bonding area adjacent to the display area, and the display area of the first substrate on one side close to the second substrate is provided with thin film transistors in an array; the second substrate is disposed opposite to the display area of the first substrate; the liquid crystal is encapsulated between the first substrate and the second substrate; an area of the second substrate is smaller than that of the first substrate, and the second substrate is between the first substrate which is provided with thin film transistors in an array and the backlight module;

wherein an edge of the first substrate further abuts a circuit board, and the circuit board and the first substrate form a panel cavity; the backlight module is disposed in the panel cavity;

wherein the backlight module comprises a backlight, a plastic frame, and a light guide plate, the light guide plate is disposed corresponding to the display area of the first substrate, the plastic frame is in the panel cavity, the backlight is disposed an region, where the projection of a driver on a surface of the plastic frame parallel to a surface of the first substrate located, of the plastic frame, a light illumination direction of the backlight is perpendicular to the surface of the first substrate, the plastic frame has a reflective structure on one side corresponding to a light exit of the backlight, and a light emitted by the backlight is reflected by the reflective structure into the light guide plate; wherein the driver is in the bonding area.

2. The display panel according to claim 1, wherein the bonding area of the first substrate further comprises a driver configured to receive an external display signal to control operations of the thin film transistors.

3. The display panel according to claim 1, wherein the circuit board comprises a first circuit board and a second circuit board, an edge of the first circuit board is bent to abut the edge of the first substrate and form a panel cavity with the first substrate, the second circuit board connects the backlight module with the first circuit board, and the first circuit board and the second circuit board are flexible circuit boards.

4. The display panel according to claim 1, wherein the backlight module further comprises a reflective sheet, the reflective sheet is attached to one side of the light guide plate away from the first substrate, and one end of the reflective sheet close to the backlight is bent to abut and attached to the plastic frame.

5. The display panel according to claim 4, wherein a circumferential side of the plastic frame of the backlight has a curved surface structure corresponding to the reflective sheet.

6. The display panel according to claim 1, wherein the backlight module further comprises a diffusion sheet and a prism sheet, the diffusion sheet and the prism sheet are attached to one side of the light guide plate close to the first substrate.

7. The display panel according to claim 1, wherein the first substrate has a thickness of 0.6 to 0.8 mm.

8. A display device, comprising the display panel according to claim 1, wherein a surface of the first substrate serves as a display side of the display device, and an outer side of the first substrate is not provided with a transparent cover.

9. The display device according to claim 8, wherein the bonding area of the first substrate further comprises a driver configured to receive an external display signal to control operations of the thin film transistors.

10. The display device according to claim 8, wherein an edge of the first substrate further abuts a circuit board, and the circuit board and the first substrate form a panel cavity; the backlight module is disposed in the panel cavity.

11. The display device according to claim 10, wherein the circuit board comprises a first circuit board and a second circuit board, an edge of the first circuit board is bent to abut the edge of the first substrate and form a panel cavity with the first substrate, the second circuit board connects the backlight module with the first circuit board, and the first circuit board and the second circuit board are flexible circuit boards.

12. The display device according to claim 10, wherein the backlight module comprises a backlight, a plastic frame, and a light guide plate, the light guide plate is disposed corresponding to the display area of the first substrate, the plastic frame is in the panel cavity, the backlight is disposed an region, where the projection of a driver on a surface of the plastic frame parallel to a surface of the first substrate located, of the plastic frame, a light illumination direction of the backlight is perpendicular to the surface of the first substrate, the plastic frame has a reflective structure on one side corresponding to a light exit of the backlight, and a light emitted by the backlight is reflected by the reflective structure into the light guide plate.

13. The display device according to claim 12, wherein the backlight module further comprises a reflective sheet, the reflective sheet is attached to one side of the light guide plate away from the first substrate, and one end of the reflective sheet close to the backlight is bent to abut and attached to the plastic frame.

14. The display device according to claim 13, wherein a circumferential side of the plastic frame of the backlight has a curved surface structure corresponding to the reflective sheet.

15. The display device according to claim 12, wherein the backlight module further comprises a diffusion sheet and a prism sheet, the diffusion sheet and the prism sheet are attached to one side of the light guide plate close to the first substrate.

16. The display device according to claim 8, wherein the first substrate has a thickness of 0.6 to 0.8 mm.

\* \* \* \* \*